United States Patent
Pan et al.

(10) Patent No.: US 10,910,602 B2
(45) Date of Patent: Feb. 2, 2021

(54) DISPLAY PANEL WITH BEAM DIFFUSION LAYER AND MANUFACTURING METHOD THEREOF, AND DISPLAY DEVICE

(71) Applicants: BOE Technology Group Co., Ltd., Beijing (CN); Fuzhou BOE Optoelectronics Technology Co., Ltd., Fuzhou (CN)

(72) Inventors: Wanping Pan, Beijing (CN); Li Cheng, Beijing (CN); Xianjuan Jin, Beijing (CN)

(73) Assignees: BOE Technology Group Co., Ltd., Beijing (CN); Fuzhou BOE Optoelectronics Technology Co., Ltd., Fuzhou (CN)

( * ) Notice: Subject to any disclaimer, the term of this patent is extended or adjusted under 35 U.S.C. 154(b) by 0 days.

(21) Appl. No.: 15/986,867

(22) Filed: May 23, 2018

(65) Prior Publication Data
US 2019/0207165 A1 Jul. 4, 2019

(30) Foreign Application Priority Data

Jan. 3, 2018 (CN) .......................... 2018 1 0004243

(51) Int. Cl.
| | |
|---|---|
| *H01L 29/08* | (2006.01) |
| *H01L 51/52* | (2006.01) |
| *H01L 27/32* | (2006.01) |
| *H01L 51/56* | (2006.01) |
| *G02B 3/00* | (2006.01) |

(52) U.S. Cl.
CPC ........ *H01L 51/5275* (2013.01); *G02B 3/0006* (2013.01); *H01L 27/322* (2013.01); *H01L 27/3211* (2013.01); *H01L 27/3276* (2013.01); *H01L 51/5253* (2013.01); *H01L 51/5281* (2013.01); *H01L 51/56* (2013.01)

(58) Field of Classification Search
USPC .......................................... 257/40
See application file for complete search history.

(56) References Cited

U.S. PATENT DOCUMENTS

| | | | | |
|---|---|---|---|---|
| 5,855,994 | A * | 1/1999 | Biebuyck | ................ C08L 83/04 313/503 |
| 5,871,872 | A * | 2/1999 | Matijevic | ............... B41M 3/003 430/7 |

(Continued)

*Primary Examiner* — Caleb E Henry
(74) *Attorney, Agent, or Firm* — Fay Sharpe LLP (57) ABSTRACT

A display panel and manufacturing method thereof and a display device are provided. The display panel includes: a base substrate, a light-emitting layer located on the base substrate, and a beam diffusion layer located on the side of a light-emergent surface of the light-emitting layer. The light-emitting layer includes a plurality of pixel units arranged in an array; and the beam diffusion layer includes a beam diffusion element corresponding to at least one of the pixel units, which is used to expand a light-emergent beam of the corresponding pixel unit. The beam diffusion element may expand the light-emergent beam of the corresponding pixel unit, which increases the area of the light-emergent surface of the pixel unit. Thus, the number of pixel units provided in a large-sized display panel may be reduced, the power consumption thereof may be decreased, and the occurrence of burn-in inside the display panel may be avoided.

20 Claims, 7 Drawing Sheets

(56) References Cited

U.S. PATENT DOCUMENTS

| | | | | |
|---|---|---|---|---|
| 5,905,328 | A * | 5/1999 | Wilkinson | H01J 29/89 |
| | | | | 313/112 |
| 6,679,621 | B2 * | 1/2004 | West | F21V 5/04 |
| | | | | 257/E33.059 |
| 7,341,358 | B2 * | 3/2008 | Hsieh | F21V 7/0091 |
| | | | | 362/97.1 |
| 8,054,409 | B2 * | 11/2011 | Hsieh | G02B 27/0927 |
| | | | | 257/79 |
| 2006/0077685 | A1 * | 4/2006 | Hsieh | F21V 7/0091 |
| | | | | 362/558 |
| 2010/0159371 | A1 * | 6/2010 | Li | C09D 17/004 |
| | | | | 430/7 |

* cited by examiner

DISPLAY PANEL WITH BEAM DIFFUSION LAYER AND MANUFACTURING METHOD THEREOF, AND DISPLAY DEVICE

CROSS-REFERENCE TO RELATED APPLICATION

This application claims priority to Chinese Patent Application No. 201810004243.0, filed with the State Intellectual Property Office on Jan. 3, 2018 and titled "Display Panel and Manufacturing Method thereof, and Display Device," the entire contents of which are incorporated herein by reference.

TECHNICAL FIELD

The present disclosure relates to a display panel and manufacturing method thereof, and display device.

BACKGROUND

With the continuous development of display technology, an organic light-emitting diode (OLED) display is a representative of attractive future display technology. The OLED display has advantages such as self-luminous, all solid-state, good mechanical property, being able to achieve soft-screen display, relatively light and thin, high brightness, high emission efficiency, fast response, low-voltage driving and low power consumption, low cost, and less procedures. The OLED display may be classified into monochrome, multi-color and full-color depending on the color; and the manufacturing of a full-color OLED display is difficult. Nowadays, a small-sized OLED display already may be mass-produced. However, relative to a small-to-medium-sized OLED display using low-temperature polysilicon technology, numerous technical difficulties have been encountered in the popularization of a large-sized OLED display using oxide technology.

An organic light-emitting layer in the large-sized OLED display is formed mainly by an evaporation process. During the evaporation process, a fine metal mask (FMM) is used for shielding, so that an organic light-emitting material is evaporated onto a specific position according to an opening shape of the mask. However, the large-sized OLED display has a high evaporation cost and a low yield, and a Fine Metal Mask with high precision is needed to be manufactured, which make it difficult for the large-sized OLED display to be mass produced. Furthermore, the increase in size is inevitably accompanied by an increase in power consumption, and since inside the OLED display is filled with solid, heat dissipation is difficult, and power consumption is increased, which inevitably cause an increase in the amount of heat within the panel, resulting in a high burn-in rate of the OLED display.

SUMMARY

The present disclosure provides a display panel. The display panel comprises: a base substrate, a light-emitting layer located on the base substrate, and a beam diffusion layer located on the side of a light-emergent surface of the light-emitting layer; wherein the light-emitting layer comprises a plurality of pixel units arranged in an array; the beam diffusion layer comprises a beam diffusion element corresponding to at least one of the pixel units, and the beam diffusion element is used to expand a light-emergent beam of the corresponding pixel unit.

In some embodiments, each of the pixel units comprises a plurality of light-emitting units of different colors.

In some embodiments, each of the pixel units at least comprises light-emitting units of three different colors of red, green and blue.

In a possible implementation, in the display panel provided above, in at least one of the pixel units, each of the light-emitting units in each of the pixel units corresponds to one beam diffusion element.

In a possible implementation, in at least one of the pixel units, each of the pixel units corresponds to one beam diffusion element.

In a possible implementation, the beam diffusion element comprises a first convex lens located on the side of a light-emergent surface of the corresponding pixel unit, and a second convex lens located on the side of a light-emergent surface of the first convex lens.

In some embodiments, an object focal point of the second convex lens is set at an image focal point of the first convex lens.

In a possible implementation, the beam diffusion element comprises a concave lens located on the side of a light-emergent surface of the corresponding pixel unit, and a third convex lens located on the side of a light-emergent surface of the concave lens.

In some embodiments, an object focal point of the third convex lens is set at an image focal point of the concave lens.

In a possible implementation, in the display panel provided above, the beam diffusion element comprises a color filter material having the same color as the corresponding light-emitting unit.

In a possible implementation, in the display panel provided above, the color filter material comprises propylene glycol methyl ether acetate, ethyl ethoxy propionate, polyethylene glycol monomethyl ether, and pigments and additives having the same color as the corresponding light-emitting unit.

In a possible implementation, the display panel further comprises: a wiring layer; the wiring layer comprises a plurality of driving units which are in one-to-one correspondence with the light-emitting units; each of the driving units is connected to the corresponding light-emitting unit for driving the corresponding light-emitting unit to emit light; the wiring layer is located between the light-emitting layer and the base substrate; or, the wiring layer is located between the light-emitting layer and the beam diffusion layer; or, a portion of the wiring layer is located between the light-emitting layer and the base substrate, and another portion thereof is located between the light-emitting layer and the beam diffusion layer.

In a possible implementation, the display panel further comprises an encapsulation layer located on the side of a light-emergent surface of the beam diffusion layer; the encapsulation layer is used to encapsulate the light-emitting layer and the beam diffusion layer.

In a possible implementation, the display panel further comprises a circular polarizing layer located on the side of a light-emergent surface of the encapsulation layer.

The present disclosure further provides a method of manufacturing a display panel, comprising: forming a light-emitting layer on a base substrate; the light-emitting layer comprises a plurality of pixel units arranged in an array; forming a beam diffusion layer on the side of a light-emergent surface of the light-emitting layer; the beam diffusion layer comprises a beam diffusion element corresponding to at least one of the pixel units, and the beam diffusion element is used to expand a light-emergent beam of the corresponding pixel unit.

In some embodiments, each of the pixel units comprises a plurality of light-emitting units of different colors.

The present disclosure further provides a display device, comprising: a display panel, wherein the display panel comprises a base substrate, a light-emitting layer located on the base substrate, and a beam diffusion layer located on the side of a light-emergent surface of the light-emitting layer; wherein the light-emitting layer comprises a plurality of pixel units arranged in an array; and the beam diffusion layer comprises a beam diffusion element corresponding to at least one of the pixel units, and the beam diffusion element is used to expand a light-emergent beam of the corresponding pixel unit.

DETAILED DESCRIPTION

In response to the problems in the prior art that it is difficult for a large-sized OLED display to be mass-produced and the difficulty in dissipating heat results in a high burn-in rate of the large-sized OLED display, an embodiment of the present disclosure provides a display panel, a manufacturing method thereof, and a display device.

The specific implementations of the display panel, the manufacturing method thereof, and the display device according to the embodiment of the present disclosure are described in detail below with reference to the accompanying drawings. The thickness and shape of each of film layers in the drawings are not drawn true to scale, which are intended only to schematically illustrate the present disclosure.

Figure 1A:
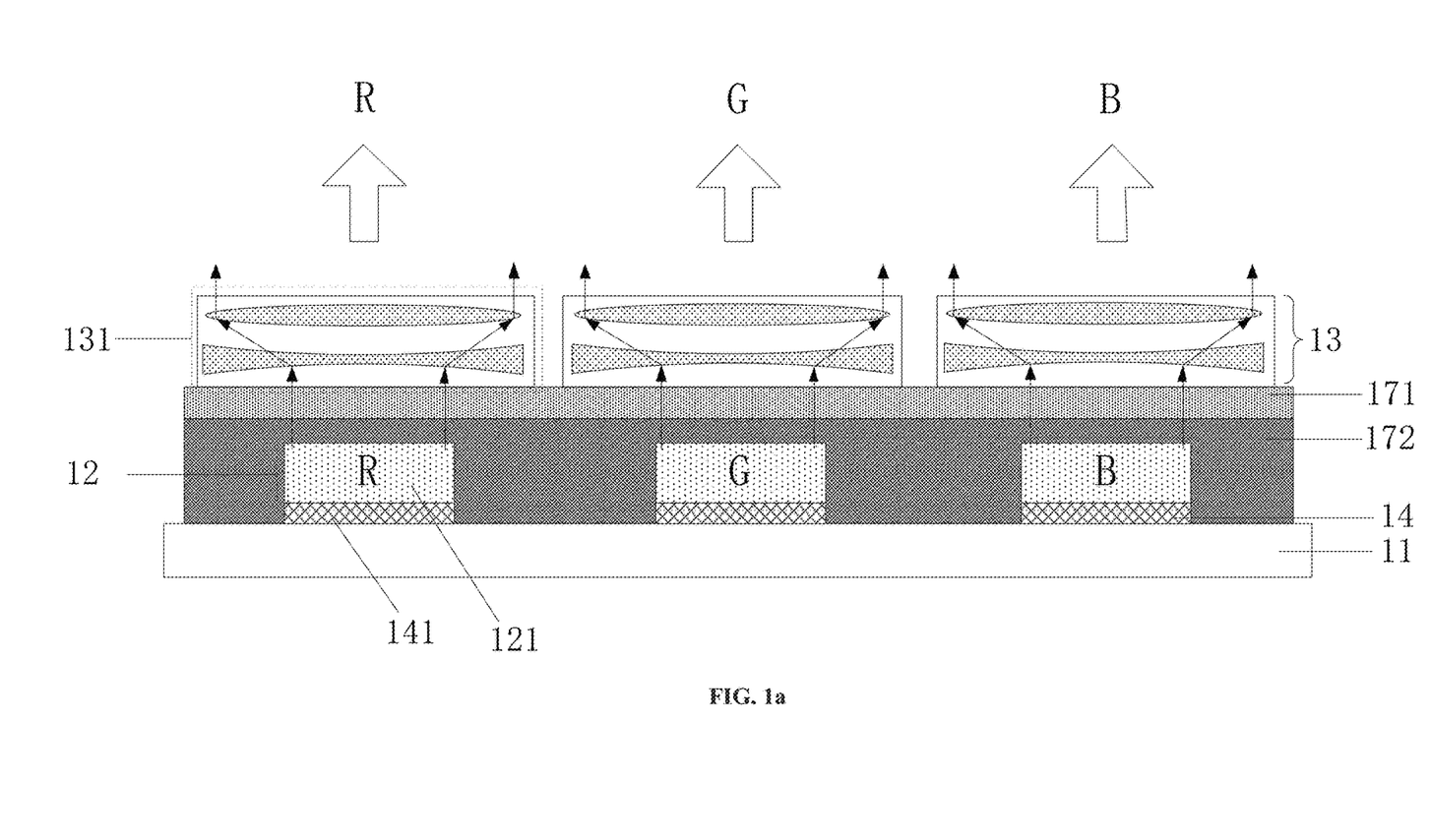
FIG. 1a is a first structural diagram of a display panel provided in embodiments of the present disclosure.

FIG. 1a shows a structure of a display panel according to an embodiment of the present disclosure. As shown in FIG. 1a, the display panel includes a base substrate 11, a light-emitting layer (i.e., a film layer where pixel units 12 are located) located on the base substrate 11, and a beam diffusion layer 13 located on the side of a light-emergent surface the light-emitting layer.

The light-emitting layer includes a plurality of pixel units 12 arranged in an array; only one pixel unit 12 is schematically shown in FIG. 1a.

The beam diffusion layer 13 includes a beam diffusion element 131 corresponding to at least one of the pixel units 12, and the beam diffusion element 131 is used to expand a light-emergent beam of the corresponding pixel unit 12.

With respect to the display panel according to the embodiment of the present disclosure, by means of providing the beam diffusion layer on the side of the light-emergent surface of the light-emitting layer, and the beam diffusion element in the beam diffusion layer may expand the light-emergent beam of the corresponding pixel unit, the area of a light-emergent surface of the display panel is increased, and thus the number of pixel units required to be provided in a large-sized display panel may be reduced, the power consumption of the large-sized display panel may be decreased, and the occurrence of burn-in resulting from the increase of the heat inside the display panel due to too much power consumption may be avoided, and the requirement for precision of the mask may also be reduced, which make it easier for the large-sized display panel to be manufactured.

It should be noted that the above-described display panel according to the embodiment of the present disclosure may be an organic electroluminescent display panel, i.e., the above-described light-emitting layer may be made of an organic electroluminescent material. In a practical application, the above-described display panel may also be other types of display panel such as a liquid crystal display panel or electronic paper, the type of the display panel is not limited herein.

Alternatively, as shown in FIG. 1a, each of the pixel units 12 may at least include a plurality of light-emitting units 121 of different colors. For example, each of the pixel units 12 may include light-emitting units 121 of three different colors of red, green, and blue.

Figure 1B:
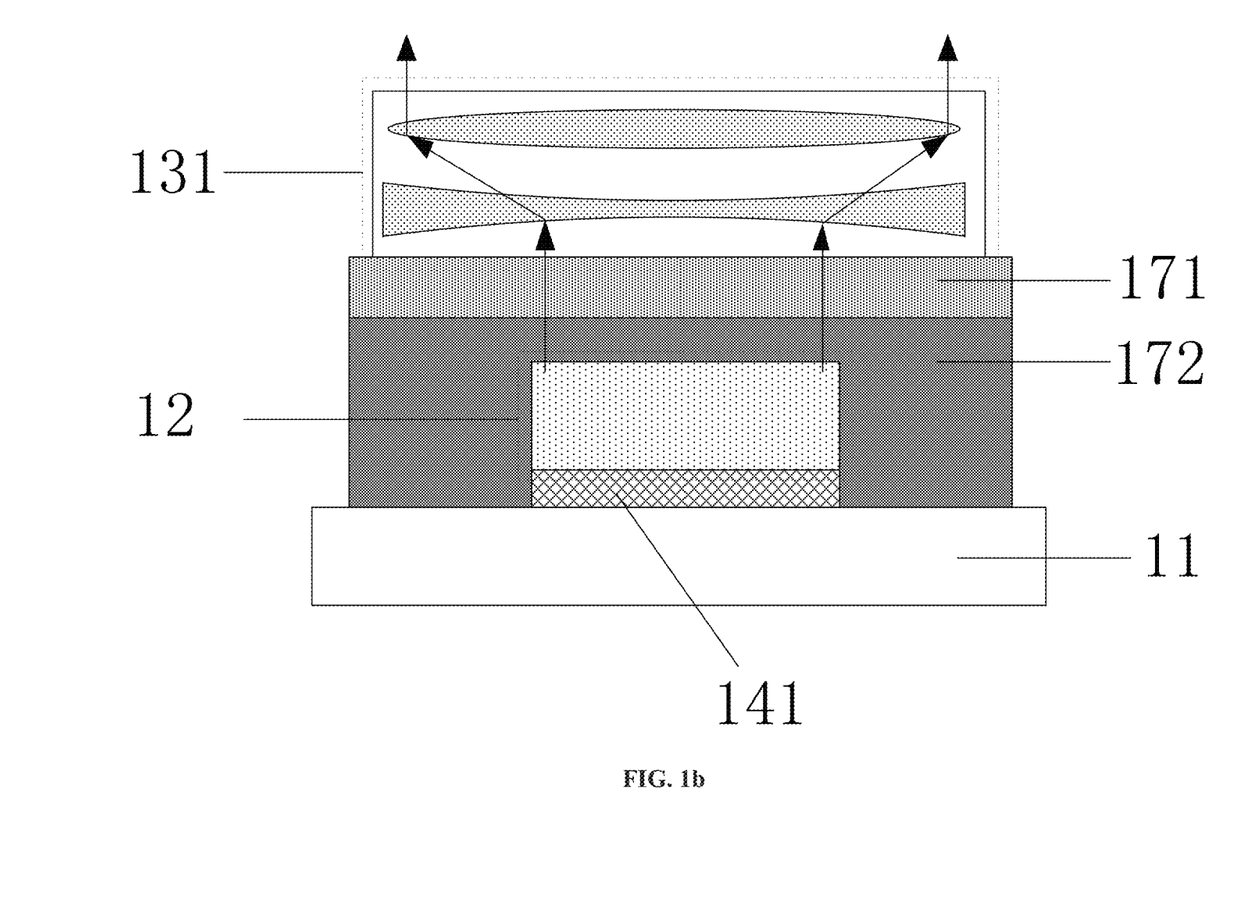
FIG. 1b is a second structural diagram of a display panel provided in embodiments of the present disclosure.

Specifically, in the above-described display panel according to the embodiment of the present disclosure, as shown in FIG. 1a, in at least one of the pixel units, each of the light-emitting units 121 in each of the pixel units 12 corresponds to one beam diffusion element 131; or, as shown in FIG. 1b, in at least one of the pixel units, each of the pixel units 12 corresponds to one beam diffusion element 131.

With respect to a structure that each of the light-emitting units 121 in each of the pixel units 12 corresponds to one beam diffusion element 131, reference is made to FIG. 1a, each of the light-emitting units 121 in the pixel unit 12 emits beams of different colors, and the light-emergent beams of each of the light-emitting units 121 are expanded after passing through the corresponding beam diffusion element 131, respectively, and then the expanded light-emergent beams may be combined into a beam of a specific color.

FIG. 1b shows another structure of the display panel according to the embodiment of the present disclosure. Referring to FIG. 1b, with respect to a structure that each of the pixel units 12 corresponds to one beam diffusion element 131, the light-emergent beams of each of the light-emitting units in the pixel unit 12 pass through the beam diffusion element 131 corresponding to the pixel unit 12 after being combined into a beam of a specific color, the beam diffusion element 131 may emit the expanded light-emergent beam. In FIG. 1b, in order to more clearly illustrate a correspondence between the pixel unit and the beam diffusion element, the light-emitting units in the pixel unit is not shown. In a practical application, each of the pixel units in FIG. 1b may include a plurality of light-emitting units of different colors, for example, may at least include light-emitting units of three different colors of red, green, and blue.

FIG. 1a and FIG. 1b illustrate an example in which one pixel unit 12 is included. In a practical application, the display panel may include a plurality of pixel units 12, and the plurality of pixel units 12 are generally arranged in an array. Referring to FIG. 1a, each of the pixel units 12 may at least include light-emitting units 121 of three different colors of red (R), green (G), and blue (B). FIG. 1a illustrates an example in which each of the pixel units 12 includes light-emitting units 121 of three colors of red (R), green (G), and blue (B). In a specific implementation, each of the pixel units 12 may also include more light-emitting units 121. For example, each of the pixel units 12 may include light-emitting units 121 of four colors of red (R), green (G), blue (B), and yellow (Y). Or each of the pixel units 12 may include light-emitting units 121 of four colors of red (R), green (G), blue (B), and white (W). The color and the number of the light-emitting units 121 included in the pixel unit 12 are not limited herein.

In the embodiment of the present disclosure, the above-described beam diffusion element may expand the light-emergent beam of the corresponding pixel unit, which increases the area of the light-emergent surface of the pixel unit. Compared to a display panel having no beam diffusion layer and having an equal area of the light-emergent surface, the number of pixel units required to be provided in the display panel according to the embodiment of the present disclosure is less, and thus the power consumption generated by the display panel is small. Moreover, since the number of pixel units is reduced, the distance between adjacent light-emitting units may be larger, which is advantageous for dispersing the heat in the display panel and reducing the burn-in rate of the display panel.

Furthermore, the area of the light-emergent surface of the display panel according to the embodiment of the present disclosure is determined by the area of the light-emergent surface of the light-emitting unit (or the pixel unit) and a magnification of the corresponding beam diffusion element. The magnification of the beam diffusion element refers to a magnification at which the area of the light-emergent surface of the light-emitting unit is taken by the beam diffusion element.

Figure 2:
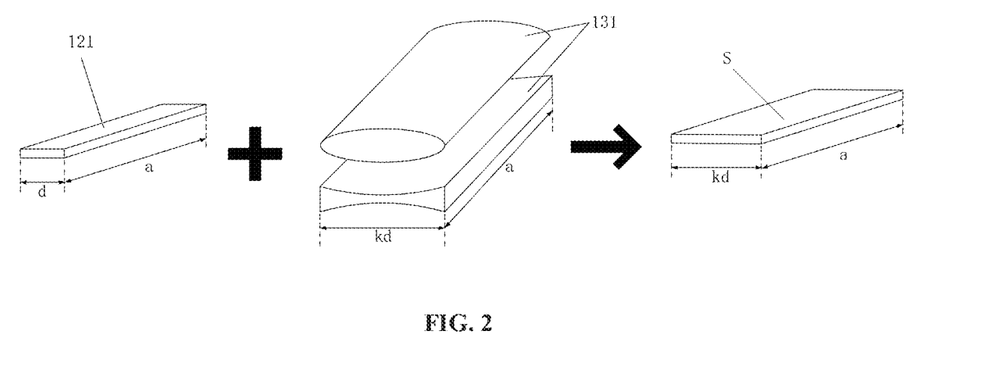
FIG. 2 shows a comparative schematic diagram of the area of the light-emergent surface through the expansion of the beam diffusion element provided in embodiments of the present disclosure.

FIG. 2 shows a comparative schematic diagram of the area of the light-emergent surface through the expansion of the beam diffusion element according to the embodiment of the present disclosure. Referring to FIG. 2, for example, the area of the light-emergent surface of the light-emitting unit 121 is a×d, and the magnification of the beam diffusion element 131 is k, i.e., the effective area of the beam diffusion element 131 is approximately a×kd, that is, the area S of the light-emergent surface of the light-emitting unit is approximately a×kd after the light-emergent beam of the light-emitting unit passes through the beam diffusion element 131. Reference is simultaneously made to FIG. 1a, the light-emitting unit 121 is located at a set position on the side of a light-in surface of the corresponding beam diffusion element 131. Since a beam emission position of the display panel is mainly determined by the position of the beam diffusion element 131, even if there is a certain deviation between the actual position of the light-emitting unit 121 and the set position, the beam emission position of the display panel will not be affected. Therefore, during the actual process, the requirement for precision of the mask is reduced. Moreover, due to the use of the beam diffusion element, the number of pixel units required to be provided in the display panel is reduced, so that the distance between adjacent light-emitting units 121 is large, and thus the evaporation process is relatively easy to be implemented, which is advantageous for mass production of the large-sized display panel. In addition, the area of the light-emitting unit 121 is smaller than the area of the light-emergent surface of the display panel, i.e., the actual area of the light-emergent surface of each of the light-emitting units 121 is smaller than the area of the light-emergent surface after being diffused by the beam diffusion element 131, and thus less raw materials are used in the evaporation process, the manufacturing cost is reduced.

In the embodiment of the present disclosure, at least one of the pixel units in the display panel corresponds to the beam diffusion element. In a practical application, a corresponding beam diffusion element may be provided for each of the pixel units within a certain region of the display panel. Thus, the density of pixel units provided within this region is low, so that the heat dissipation performance at this position may be improved. The position of the beam diffusion element may be set according to actual needs, which is not limited in the embodiment of the present disclosure.

Further, in the above-described display panel according to the embodiment of the present disclosure, each of the light-emitting units in each of the pixel units corresponds to one beam diffusion element. Therefore, the light-emergent beams of each of the light-emitting units in the display panel may be expanded by the beam diffusion element, the area of the light-emergent surface of the display panel may be greatly increased. Moreover, the uniform distribution of the beam diffusion elements is advantageous for mass production of the large-sized OLED display panel.

Figure 3:
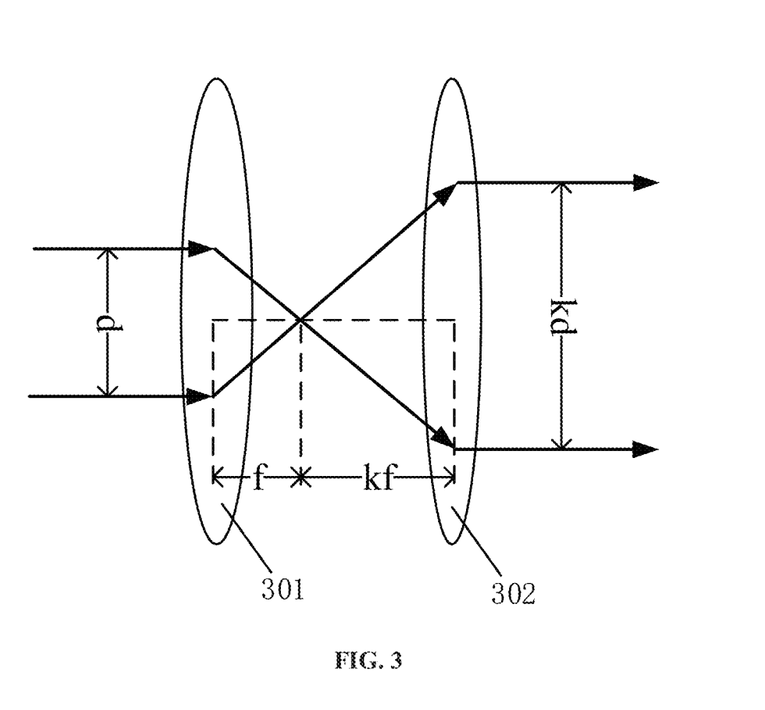
FIG. 3 is a first structural diagram of a beam diffusion element provided in embodiments of the present disclosure.

Exemplarily, in the above-described display panel according to the embodiment of the present disclosure, the above-described beam diffusion element at least includes the following two implementations:

Implementation I:

FIG. 3 shows a structure of a beam diffusion element according to the embodiment of the present disclosure. As shown in FIG. 3, the beam diffusion element 131 includes a first convex lens 301 located on the side of a light-emergent surface of the corresponding light-emitting unit 121, and a second convex lens 302 located on the side of a light-emergent surface of the first convex lens 301.

FIG. 3 illustrates an example in which a focal length of the first convex lens 301 is f and a focal length of the second convex lens 302 is kf. The parallel beams with a width d emitted by the light-emitting unit 121 converges at the focal length of the first convex lens 301 after passing through the first convex lens 301. In a specific implementation, in order to make an emissive beam of the beam diffusion element 131 parallel to an incident beam thereof, an object focal point of the second convex lens 302 may be set at an image focal point of the first convex lens 301. Thus, the beam passing through the focal length of the first convex lens 301 continues to propagate, and then emits in parallel after passing through the second convex lens 302, and the beam width of the emissive beam is kd, i.e., the width of the beam passing through the beam diffusion element 131 is increased by k times.

Figure 4:
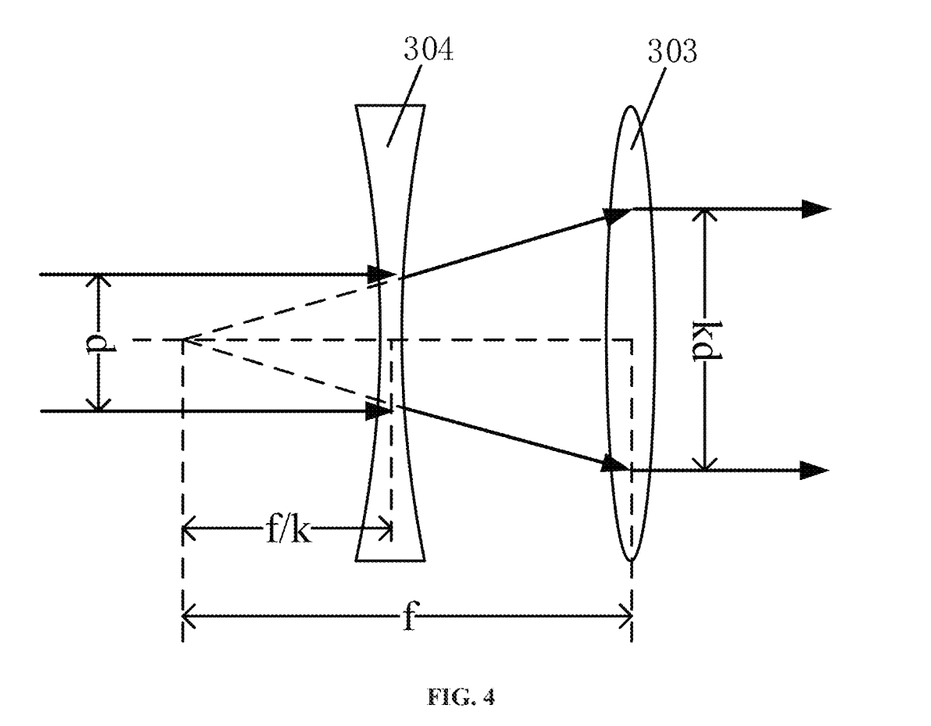
FIG. 4 is a second structural diagram of a beam diffusion element provided in embodiments of the present disclosure.

Implementation II:

FIG. 4 shows a structure of another beam diffusion element according to the embodiment of the present disclosure. As shown in FIG. 4, the beam diffusion element 131 includes a concave lens 304 located on the side of a light-emergent surface of the corresponding light-emitting unit 121, and a third convex lens 303 located on the side of a light-emergent surface of the concave lens 304.

FIG. 4 illustrates an example in which a focal length of the third convex lens 303 is k times a focal length of the concave lens 304. After the parallel beam with a width d emitted by the light-emitting unit 121 passes through the concave lens 304, the emitted beam is a divergent beam, and a reversely extending line of the divergent beam converges at the focal length of the concave lens 304. In a specific implementation, in order to make the emissive beam of the beam diffusion element 131 parallel to the incident beam thereof, an object focal point of the third convex lens 303 may be set at an image focal point of the concave lens 304. Thus, the divergent beam passing through the concave lens 304 continues to propagate, and then emits in parallel after passing through the third convex lens 303, and the beam width of the emissive beam is kd, i.e., the width of the beam passing through the beam diffusion element 131 is increased by k times.

In a specific implementation, reference is simultaneously made to FIG. 1a, for the implementation I or II described above, in the beam diffusion layer 13, in order to maintain a set distance between the lenses, a transparent medium is generally provided between two lenses. Likewise, a transparent medium is also provided between the light-emitting layer and the beam diffusion layer 13, which, on the one hand, maintains the set distance between the light-emitting unit 121 and the corresponding beam diffusion element 131, and on the other hand, may also play a role of flattening. Like a first flat layer 171 and a second flat layer 172 in FIG. 1a, during the actual process, the first flat layer 171 and the second flat layer 172 may also be combined into one flat layer as long as it plays a role of flattening and isolating, which is not limited herein.

Further, in the above-described display panel according to the embodiment of the present disclosure, the beam diffusion element may include a color filter material having the same color as the corresponding light-emitting unit. Referring to FIG. 1a, which illustrates an example in which each of the pixel units 12 includes light-emitting units 121 of three colors of red (R), green (G), and blue (B), the beam diffusion element 131 corresponding to the red light-emitting unit 121 can only transmit red light, and the beam diffusion element 131 corresponding to the green light-emitting unit 121 can only transmit green light, and the beam diffusion element 131 corresponding to the blue light-emitting unit 121 can only transmit blue light. Furthermore, in a specific implementation, if the light-emitting unit 121 is of another color, the beam diffusion element 131 is made of a color filter material having the same color as the corresponding light-emitting unit 121. Thus, after the beam emitted by the light-emitting unit 121 passes through the corresponding beam diffusion element 131, the light loss generated is small. Moreover, the beam emitted by the light-emitting unit 121 may be further purified to improve the display effect of the display panel.

In a practical application, a Half Tone Mask may be used to manufacture a beam diffusion layer through multiple exposure processes, and other methods may also be used, which is not limited herein.

Exemplarily, in the above-described display panel according to the embodiment of the present disclosure, the color filter material may include: propylene glycol methyl ether acetate, ethyl ethoxy propionate, polyethylene glycol monomethyl ether, and pigments and additives having the same color as the corresponding light-emitting unit.

Exemplarily, the components of the color filter material used in the beam diffusion element may be mixed in the following proportions:
propylene glycol methyl ether acetate 55~65%;
ethyl ethoxy propionate 15~20%;
polyethylene glycol monomethyl ether 7~13%;
resin 1~8%;
pigments (R/G/B) 1~9%; and
additives 2~9%.

In a specific implementation, as shown in FIG. 1a, the above-described display panel according to the embodiment of the present disclosure may further include a wiring layer 14.

The wiring layer 14 includes a plurality of driving units 141 which are in one-to-one correspondence with the light-emitting units 121.

Each of the driving units 141 is connected to the corresponding light-emitting unit 121 for driving the corresponding light-emitting unit 121 to emit light.

The wiring layer 14 may be located between the light-emitting layer and the base substrate 11. Or, the wiring layer 14 may be located between the light-emitting layer and the beam diffusion layer 13. Furthermore, a portion of the wiring layer 14 may be located between the light-emitting layer and the base substrate 11, and another portion thereof may be located between the light-emitting layer and the beam diffusion layer 13.

Exemplarily, each of the driving units 141 may be a driving circuit including at least one Thin-film transistor (TFT) for driving the corresponding light-emitting unit to emit light of a specific color.

Figure 5:
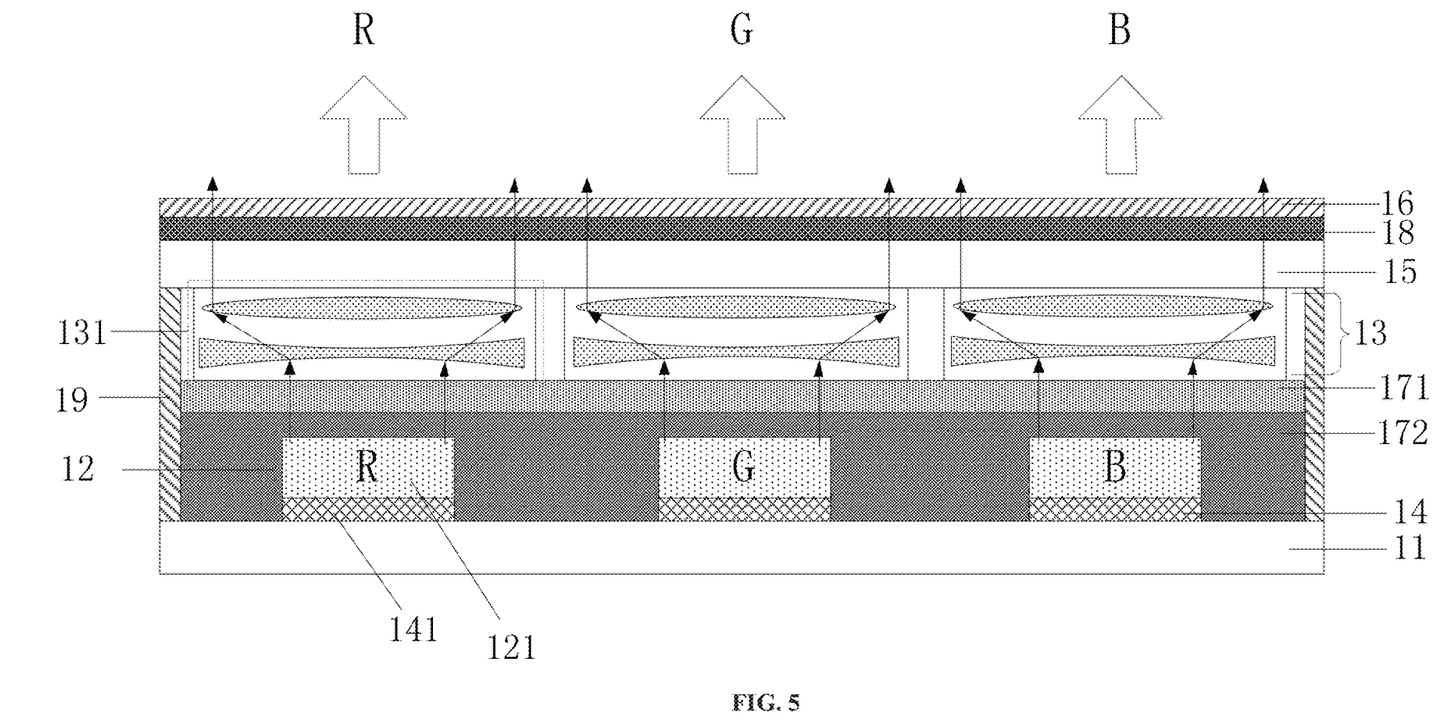
FIG. 5 is a third structural diagram of a display panel provided in embodiments of the present disclosure.
Figure 6:
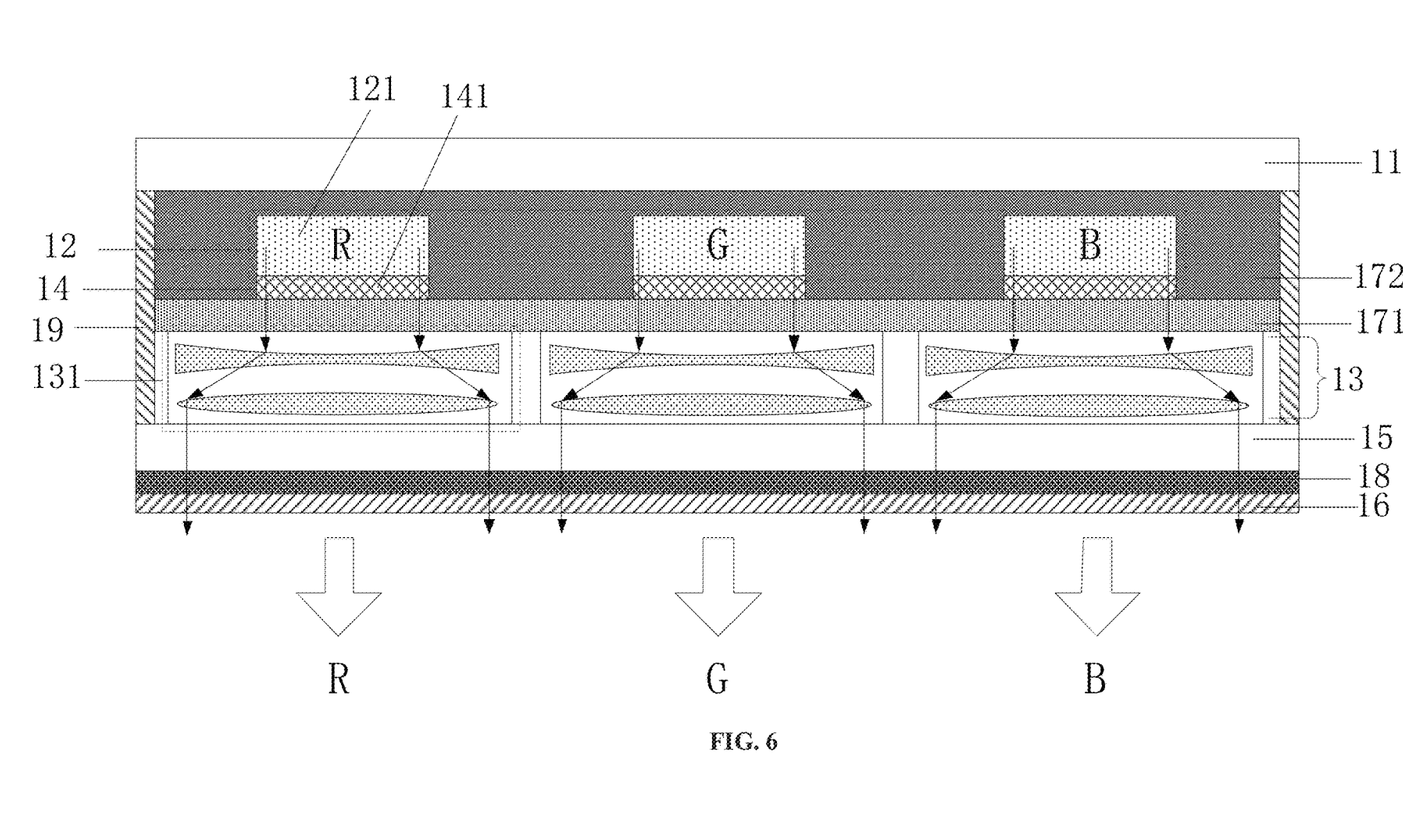
FIG. 6 is a sixth structural diagram of a display panel provided in embodiments of the present disclosure.

FIG. 5 shows yet another structure of the display panel according to the embodiment of the present disclosure. Referring to FIG. 1a and FIG. 5, the above-described display panel may be a top emission type OLED display panel, and at this point, the wiring layer 14 is located between the light-emitting layer and the base substrate 11. FIG. 6 shows still another structure of the display panel according to the embodiment of the present disclosure. As shown in FIG. 6, the above-described display panel may also be a bottom emission type OLED display panel, and at this point, the wiring layer 14 is located between the light-emitting layer and the beam diffusion layer 13. Furthermore, in a practical application, the wiring layer may generally include a plurality of film layers. On the basis of not affecting the functions of the driving units in the wiring layer, a part of the film layers in the wiring layer may also be provided between the light-emitting layer and the base substrate, and another part thereof may be provided between the light-emitting layer and the beam diffusion layer. For example, the wiring layer may generally include six film layers, three film layers of which may be provided between the light-emitting layer and the base substrate, and another three film layers of which may be provided between the light-emitting layer and the beam diffusion layer. This is merely illustrative and does not limit the number and the specific distribution of film layers included in the wiring layer.

In a specific implementation, when the above-described display panel is an OLED display panel, the above-described light-emitting unit may generally include: an anode, a cathode located on the side of the anode facing away from the base substrate, and a light-emitting layer located between the anode and the cathode. Generally, the light-emergent direction of the display panel may be controlled by means of providing a reflective layer on the side of the anode close to the base substrate or on the side of the cathode facing away from the base substrate, so as to achieve top emission or bottom emission light-emergent. It should be noted that, in the embodiment of the present disclosure, the "anode" and the "cathode" are also interchangeable.

Exemplarily, the above-described wiring layer is located between the light-emitting layer and the base substrate, which may mean that the wiring layer is located between the light-emitting layer and the anode, or may mean that the wiring layer is located between the anode and the base substrate. Or, it may also mean that a portion of the wiring layer is located between the light-emitting layer and the anode, and another portion thereof is located between the anode and the base substrate. The above-described wiring layer is located between the light-emitting layer and the beam diffusion layer, which may mean that the wiring layer is located between the light-emitting layer and the cathode, or may mean that the wiring layer is located between the cathode and the beam diffusion layer, or may also mean that a portion of the wiring layer is located between the light-emitting layer and the cathode, and another portion thereof is located between the cathode and the beam diffusion layer. Furthermore, a portion of the wiring layer is located between the light-emitting layer and the base substrate, and another portion thereof is located between the light-emitting layer and the beam diffusion layer, which may mean that a portion of the wiring layer is located between the light-emitting layer and the anode, and another portion thereof is located between the light-emitting layer and the cathode. In addition, other distribution methods may also be used, which is not limited herein.

In a practical application, in the above-described display panel according to the embodiment of the present disclosure, as shown in FIG. 5 or FIG. 6, it may further include an encapsulation layer 15 located on the side of a light-emergent surface of the beam diffusion layer 13.

The encapsulation layer 15 is used to encapsulate the light-emitting layer and the beam diffusion layer 13.

In order to ensure good performance of the light-emitting layer in the OLED display panel, an encapsulation layer 15 is generally provided to isolate water and oxygen. In a practical application, the structure as shown in FIG. 5 or FIG. 6 may be used, i.e., an encapsulation layer 15 may be provided in the display panel, and the encapsulation layer 15 and the base substrate 11 are adhered together by means of a frame sealing adhesive 19 to encapsulate the light-emitting layer and the beam diffusion layer 13. The above-described frame sealing adhesive may be an ultraviolet curing (UV) adhesive, and other materials may also be used, which is not limited herein. In a specific implementation, the display panel may also be encapsulated by means of thin film encapsulation, which is not limited herein. Moreover, FIG. 5 or FIG. 6 only illustrates one pixel unit 12, and in a practical application, all of the pixel units 12 on the display panel are generally encapsulated together in a similar manner.

In a specific implementation, as shown in FIG. 5 or FIG. 6, the above-described display panel according to the embodiment of the present disclosure may further include a circular polarizing layer 16 located on the side of a light-emergent surface of the encapsulation layer 15. Since the external light may be reflected by a metal layer (for example, the cathode or the anode) inside the display panel when irradiated onto the display panel, the reflected light will affect the contrast of the display panel and affect the display effect of the display panel. By means of providing the circular polarizing layer 16 on the side of a light-emergent surface of the display panel, the user cannot see the external light reflected by the surface of the metal layer, so that the contrast of the display panel is improved, and the display effect of the display panel is further improved.

In a practical application, referring also to FIG. 5 or FIG. 6, a touch electrode layer 18 may also be provided between the encapsulation layer 15 and the circular polarizing layer 16 to realize a touch function, and other functional layers may also be provided, which is not limited herein.

Figure 7:
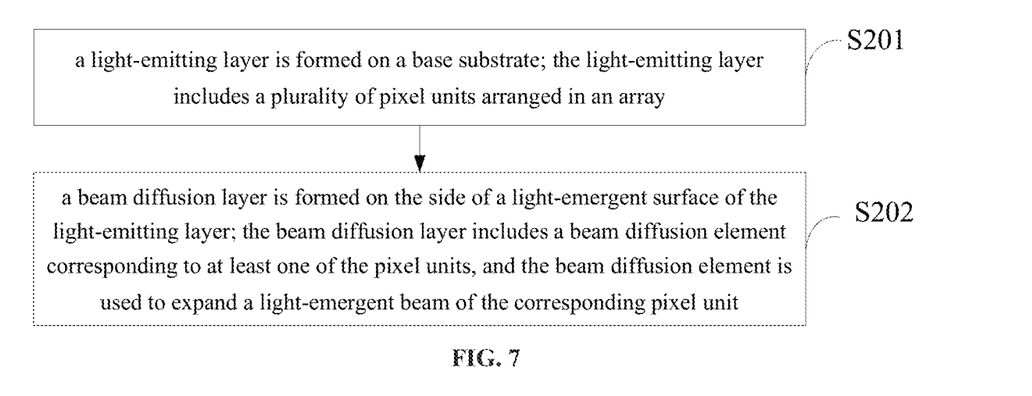
FIG. 7 is a flowchart of a method of manufacturing a display panel provided in embodiments of the present disclosure.

Based on the same inventive concept, an embodiment of the present disclosure further provides a method of manufacturing the above-described display panel. As shown in FIG. 7, the method may include the following operations.

In step S201, a light-emitting layer is formed on a base substrate; the light-emitting layer includes a plurality of pixel units arranged in an array.

Each of the pixel units at least includes a plurality of light-emitting units of different colors. For example, it may include light-emitting units of three different color of red, green, and blue.

In step S202, a beam diffusion layer is formed on the side of a light-emergent surface of the light-emitting layer; the beam diffusion layer includes a beam diffusion element corresponding to at least one of the pixel units, and the beam diffusion element is used to expand a light-emergent beam of the corresponding pixel unit.

With respect to the method of manufacturing the above-described display panel according to the embodiment of the present disclosure, by means of forming the beam diffusion layer on the side of the light-emergent surface of the light-emitting layer, and the beam diffusion element in the beam diffusion layer may expand the light-emergent beam of the corresponding pixel unit, the area of a light-emergent surface of the display panel is increased, and thus the number of pixel units required to be provided in a large-sized display panel may be reduced, the power consumption of the large-sized display panel may be decreased, and the occurrence of burn-in resulting from the increase of the heat inside the display panel due to too much power consumption may be avoided, and the requirement for precision of the mask may also be reduced, which make it easier for the large-sized display panel to be manufactured.

For example, the above-described display panel according to the embodiment of the present disclosure may be an organic electroluminescent display panel, and thus the light-emitting layer formed in step S201 is an organic light-emitting layer in an OLED display panel, and film layers in the organic light-emitting layer may be manufactured by an evaporation process. Furthermore, the above-described display panel according to the embodiment of the present disclosure may also be a liquid crystal display panel, and thus forming the light-emitting layer in step S201 may also refer to forming a liquid crystal layer. In a specific implementation, the specific process of forming the light-emitting layer in the above step S201 needs to be determined according to the type of the display panel, which is not limited herein.

Exemplarily, in the above step S202, a Half Tone Mask may be used to manufacture a beam diffusion layer through multiple exposure processes. The pattern of the Half Tone Mask needs to be set based on the specific structure of the beam diffusion element. The beam diffusion layer may also be manufactured in other ways, which is not limited herein. Alternatively, a color filter material may be incorporated in the material for manufacturing the beam diffusion layer, and the color filter material included in each of the beam diffusion elements has the same color as the corresponding light-emitting unit, which plays a role of further purifying the beam and reducing the light loss of the beam.

Since the principle of the manufacturing method to solve the problem is similar to that of the above-described display panel, the implementation of the manufacturing method may refer to the implementation of the above-described display panel, and the repeated description related thereto will be omitted.

Based on the same inventive concept, an embodiment of the present disclosure further provides a display device including the above-described display panel. For example, the display device may include a display panel as shown in FIG. 1a, FIG. 1b, FIG. 5, or FIG. 6. The display device may be applied to any product or component having a display function such as a mobile phone, a tablet computer, a television, a displayer, a notebook computer, a digital photo frame, a navigator, and the like. Since the principle of the display device to solve the problem is similar to that of the above-described display panel, the implementation of the display device may refer to the implementation of the above-described display panel, and the repeated description related thereto will be omitted.

With respect to the display panel, the manufacturing method thereof, and the display device according to the embodiment of the present disclosure, by means of providing the beam diffusion layer on the side of the light-emergent surface of the light-emitting layer, and the beam diffusion element in the beam diffusion layer may expand the light-emergent beam of the corresponding light-emitting unit, the area of a light-emergent surface of the display panel is increased, and thus the number of pixel units in a large-sized display panel may be reduced, the power consumption of the large-sized display panel may be decreased, and the occurrence of burn-in resulting from the increase of the heat inside the display panel due to too much power consumption may be avoided, and the requirement for precision of the mask may also be reduced, which make it easier for the large-sized display panel to be manufactured. Furthermore, the beam diffusion element is made of a color filter material having the same color as the corresponding light-emitting unit, and thus after the beam emitted by the light-emitting unit passes through the corresponding beam diffusion element, the light loss generated is small; moreover, the beam emitted by the light-emitting unit maybe further purified to improve the display effect of the display panel.

Modifications and variations to the present disclosure may be available to those skilled in the art without departing from the spirits and scope of the present disclosure. The present disclosure is intended to cover these modifications and variations if the modifications and variations fall within the scope indicated by the claims and the equivalent technical scopes.

What is claimed is:

1. A display panel, comprising a base substrate, a light-emitting layer located on the base substrate, and a beam diffusion layer located on the side of a light-emergent surface of the light-emitting layer; wherein
    the light-emitting layer comprises a plurality of pixel units arranged in an array;
    the beam diffusion layer comprises a beam diffusion element corresponding to at least one of the pixel units, and the beam diffusion element is used to expand a light-emergent beam of the corresponding pixel unit,
    wherein each of the pixel units comprises a plurality of light-emitting units of different colors,
    wherein the display panel further comprises a wiring layer, the wiring layer comprises a plurality of driving units which are in one-to-one correspondence with the light-emitting units; and each of the driving units is connected to the corresponding light-emitting unit for driving the corresponding light-emitting unit to emit light, and
    wherein, the wiring layer is located between the light-emitting layer and the beam diffusion layer; or, a portion of the wiring layer is located between the light-emitting layer and the base substrate, and another portion thereof is located between the light-emitting layer and the beam diffusion layer.

2. The display panel according to claim 1, wherein
    each of the pixel units at least comprises light-emitting units of three different colors of red, green and blue.

3. The display panel according to claim 1, wherein
    in at least one of the pixel units, each of the light-emitting units in each of the pixel units corresponds to one beam diffusion element.

4. The display panel according to claim 1, wherein
    in at least one of the pixel units, each of the pixel units corresponds to one beam diffusion element.

5. The display panel according to claim 1, wherein the beam diffusion element comprises a first convex lens located on the side of a light-emergent surface of the corresponding pixel unit, and a second convex lens located on the side of a light-emergent surface of the first convex lens.

6. The display panel according to claim 5, wherein
    an object focal point of the second convex lens is set at an image focal point of the first convex lens.

7. The display panel according to claim 1, wherein
    the beam diffusion element comprises a concave lens located on the side of a light-emergent surface of the corresponding pixel unit, and a third convex lens located on the side of a light-emergent surface of the concave lens.

8. The display panel according to claim 7, wherein
    an object focal point of the third convex lens is set at an image focal point of the concave lens.

9. The display panel according to claim 3, wherein the beam diffusion element comprises a color filter material having the same color as the corresponding light-emitting unit.

10. The display panel according to claim 9, wherein the color filter material comprises propylene glycol methyl ether acetate, ethyl ethoxy propionate, polyethylene glycol monomethyl ether, and pigments and additives having the same color as the corresponding light-emitting unit.

11. The display panel according to claim 1, further comprising an encapsulation layer located on the side of a light-emergent surface of the beam diffusion layer;
    the encapsulation layer is used to encapsulate the light-emitting layer and the beam diffusion layer.

12. The display panel according to claim 11, further comprising a circular polarizing layer located on the side of a light-emergent surface of the encapsulation layer.

13. A method of manufacturing a display panel, comprising:
    forming a light-emitting layer on a base substrate; the light-emitting layer comprises a plurality of pixel units arranged in an array;
    forming a beam diffusion layer on the side of a light-emergent surface of the light-emitting layer; the beam diffusion layer comprises a beam diffusion element corresponding to at least one of the pixel units, and the beam diffusion element is used to expand a light-emergent beam of the corresponding pixel unit,
    wherein each of the pixel units comprises a plurality of light-emitting units of different colors,
    wherein the display panel further comprises a wiring layer comprising a plurality of driving units which are in one-to-one correspondence with the light-emitting units; and each of the driving units is connected to the corresponding light-emitting unit for driving the corresponding light-emitting unit to emit light, and
    wherein, the wiring layer is located between the light-emitting layer and the beam diffusion layer; or, a portion of the wiring layer is located between the light-emitting layer and the base substrate, and another portion thereof is located between the light-emitting layer and the beam diffusion layer.

14. A display device, comprising a display panel;
the display panel comprises a base substrate, a light-emitting layer located on the base substrate, and a beam diffusion layer located on the side of a light-emergent surface of the light-emitting layer; wherein
the light-emitting layer comprises a plurality of pixel units arranged in an array;
the beam diffusion layer comprises a beam diffusion element corresponding to at least one of the pixel units, and the beam diffusion element is used to expand a light-emergent beam of the corresponding pixel unit,
wherein each of the pixel units comprises a plurality of light-emitting units of different colors,
wherein the display panel further comprises a wiring layer comprising a plurality of driving units which are in one-to-one correspondence with the light-emitting units; and each of the driving units is connected to the corresponding light-emitting unit for driving the corresponding light-emitting unit to emit light, and
wherein, the wiring layer is located between the light-emitting layer and the beam diffusion layer; or, a portion of the wiring layer is located between the light-emitting layer and the base substrate, and another portion thereof is located between the light-emitting layer and the beam diffusion layer.

15. The display device according to claim 14, wherein in at least one of the pixel units, each of the light-emitting units in each of the pixel units corresponds to one beam diffusion element.

16. The display device according to claim 14, wherein in at least one of the pixel units, each of the pixel units corresponds to one beam diffusion element.

17. The display device according to claim 14, wherein the beam diffusion element comprises a first convex lens located on the side of a light-emergent surface of the corresponding pixel unit, and a second convex lens located on the side of a light-emergent surface of the first convex lens.

18. The display device according to claim 17, wherein an object focal point of the second convex lens is set at an image focal point of the first convex lens.

19. The display device according to claim 14, wherein the beam diffusion element comprises a concave lens located on the side of a light-emergent surface of the corresponding pixel unit, and a third convex lens located on the side of a light-emergent surface of the concave lens.

20. The display device according to claim 14, wherein the display panel comprises an encapsulation layer located on the side of a light-emergent surface of the beam diffusion layer;
the encapsulation layer is used to encapsulate the light-emitting layer and the beam diffusion layer.

* * * * *